United States Patent
Caldwell et al.

(10) Patent No.: US 6,645,344 B2
(45) Date of Patent: Nov. 11, 2003

(54) UNIVERSAL BACKPLANE ASSEMBLY AND METHODS

(75) Inventors: Doug Caldwell, McKinney, TX (US); Albert Garcia, Jr., Gilbert, AZ (US); Thomas J. Horback, Gilbert, AZ (US); Michael James Lombardi, Phoenix, AZ (US); Mark McNicholas, Gilbert, AZ (US); Dean Mize, Sachse, TX (US); Gon Wang, Gilbert, AZ (US)

(73) Assignee: Tokyo Electron Limited, Tokyo (JP)

( * ) Notice: Subject to any disclaimer, the term of this patent is extended or adjusted under 35 U.S.C. 154(b) by 180 days.

(21) Appl. No.: 09/861,322

(22) Filed: May 18, 2001

(65) Prior Publication Data

US 2002/0172764 A1 Nov. 21, 2002

(51) Int. Cl.[7] .......................... H01L 21/00; C23C 16/00
(52) U.S. Cl. ........................... 156/345.53; 156/345.51; 156/345.52; 118/728; 118/500; 204/298.01; 361/234
(58) Field of Search ............................ 118/728, 500, 118/715–730; 156/345.51, 345.52, 345.53; 204/298.01; 361/234

(56) References Cited

U.S. PATENT DOCUMENTS

| | | | |
|---|---|---|---|
| 4,788,994 A | 12/1988 | Shinbara | 134/157 |
| 4,915,564 A | 4/1990 | Eror et al. | 414/217 |
| 5,342,471 A * | 8/1994 | Fukasawa et al. | 156/345.47 |
| 5,516,732 A | 5/1996 | Flegal | 437/250 |
| 5,556,500 A * | 9/1996 | Hasegawa et al. | 156/345.27 |
| 5,710,407 A | 1/1998 | Moore et al. | 219/405 |
| 5,879,459 A * | 3/1999 | Gadgil et al. | 118/715 |
| 5,925,226 A * | 7/1999 | Hurwitt et al. | 204/298.15 |
| 5,972,163 A * | 10/1999 | Haji | 156/345.54 |
| 6,113,704 A * | 9/2000 | Satoh et al. | 118/728 |
| 6,203,622 B1 * | 3/2001 | Halpin et al. | 118/730 |
| 6,310,323 B1 * | 10/2001 | Mahawili et al. | 219/390 |
| 6,313,441 B1 * | 11/2001 | Schaper et al. | 219/390 |
| 6,508,883 B1 * | 1/2003 | Tanguay | 118/719 |

FOREIGN PATENT DOCUMENTS

| | | | | |
|---|---|---|---|---|
| EP | 1028454 | | 8/2000 | H01L/21/00 |
| EP | 1132948 | | 9/2001 | H01L/21/00 |
| JP | 09172058 A | * | 6/1997 | H01L/21/68 |

* cited by examiner

Primary Examiner—Gregory Mills
Assistant Examiner—Ram N Kackar
(74) Attorney, Agent, or Firm—Wood, Herron & Evans, L.L.P.

(57) ABSTRACT

A backplane assembly for a substrate processing system that is selectively configurable to provide an effective thermal contact with substrates of differing sizes. The backplane assembly includes a backplane base installed in a vacuum chamber of the substrate processing system and plural faceplates which are removably mountable to the backplane base. The backplane assembly is operable for regulating the temperature of the substrate and include elements that promote the efficient transfer of heat between the backplane base and the faceplate to perform the temperature regulation during processing. Each of the faceplates has a contact surface dimensioned and configured to engage a correspondingly dimensioned and/or configured type of substrate. The faceplates are readily demountable from the backplane base for exchange to accommodate a change in the dimension and/or configuration of the substrates being processed by the substrate processing system without removing the backplane base from the vacuum chamber.

55 Claims, 5 Drawing Sheets

UNIVERSAL BACKPLANE ASSEMBLY AND METHODS

This invention relates to semiconductor manufacture and processing and, in particular, to a backplane assembly for contacting and regulating the temperature of a semiconductor substrate during processing in a semiconductor processing system.

BACKGROUND OF THE INVENTION

The fabrication of integrated circuits in and on a semiconductor substrate involves multiple processing steps which are serially performed in a succession of semiconductor processing systems and which have the ultimate objective of creating arrays of interconnected devices. Semiconductor processing systems incorporate one or more substrate processing stations, which are configured to perform processing steps, such as depositing a thin film of a coating material onto an exposed surface of a substrate or plasma cleaning the exposed surface to remove a contamination layer, such as an oxide, from the exposed surface prior to deposition. Although such conventional semiconductor processing systems are generally suitable for processing substrates, these systems have certain significant drawbacks that limit their application for fabricating integrated circuits.

A typical semiconductor processing system requires the integration of numerous sub-assemblies into a single vacuum chamber. The sub-assemblies cooperate to perform one or more processing steps in the sub-atmospheric environment of the vacuum chamber. Among the sub-assemblies are substrate supports which hold and support the substrates during processing. Substrate supports may be constructed of a substrate holder which secures a substrate with a clamping structure and a backplane having a contact surface that engages the substrate secured by the substrate holder. The backplane is used to regulate the temperature of the engaged substrate during processing. For example, the backplane may be provided with a heating element for elevating the temperature of the substrate. Heat is transferred by thermal conduction between the heated backplane and the substrate. To increase the uniformity of the heat transfer, a flow of a heat transfer gas may be provided between the substrate and the contact surface.

Conventional semiconductor processing systems have complicated designs which are difficult and expensive to fabricate and maintain. The disassembly and reassembly of the individual sub-assemblies from the vacuum chamber is tedious and often requires that the entire processing system be shut down for as much as one or more days to repair or replace components. Even a shutdown measured in hours can be costly as the downtime has a ripple effect along the production line, which significantly decreases the throughput of the production line and further increases the indirect costs of maintaining each individual processing system. Production equipment is only useful when actually making a product and any production stoppage is expensive when an entire production line is idled.

Common semiconductor substrates are flexible circular wafers that are available in a number of outside diameters, for example, 100 mm (4 inch), 150 mm (6 inch), 200 mm (8 inch) and 300 mm (12 inch). The contact surface of the backplane has a surface area specified to abut a major portion of the rear face of the substrate opposite the exposed face undergoing processing by the semiconductor processing system. When the substrate processing system is reconfigured to reflect a change in the dimension and/or configuration of the substrates to be processed, the existing backplane must be removed from the system and replaced with a different backplane having a contact surface of suitable dimension and configuration to engage the substrates of differing dimension and/or configuration. To perform the replacement, the vacuum chamber of the system is vented to atmospheric pressure and the various cables and fluid lines are disconnected from the existing backplane. The existing backplane is unfastened and removed from its mounting opening. In certain semiconductor processing systems, the entire plenum of the vacuum chamber must be opened to afford maintenance personnel the access required to remove the backplane. During the backplane exchange, atmospheric gases, such as water vapor and other volatile species, can enter through the mounting opening, or open plenum, and adsorb on internal surfaces of the vacuum chamber. The adsorbed amounts of atmospheric and volatile species is commensurate with the duration of the atmospheric exposure. After the different backplane is mounted and the vacuum chamber is resealed and evacuated, the return of the system vacuum to an acceptable sub-atmospheric pressure level depends upon the quantity of adsorbed atmospheric species. In extreme cases, the semiconductor processing system may require a heat treatment or bake to remove the adsorbed species. Thus, the replacement of a conventional backplane involves not only the time required for the actually exchange but also the time required to reestablish an acceptable vacuum pressure in the vacuum chamber.

An objective of this invention is to provide a backplane that is readily adaptable to a change in the dimension and/or configuration of the substrates being processed by the semiconductor processing system.

SUMMARY OF THE INVENTION

The forgoing objective has been accomplished, according to the present invention, by providing a backplane assembly for a substrate processing system comprising a backplane base mountable within the vacuum chamber of a substrate processing system and at a position suitable for processing substrates, a first faceplate removably mountable to the backplane base, and a second faceplate removably mountable to the backplane base. The first and second faceplates are each sized to be insertable through an access port of the vacuum chamber for mounting to the backplane base. The first faceplate has a first contact surface dimensioned and configured to provide an efficient thermal contact with a correspondingly dimensioned and/or configured first type of substrate. The second faceplate has a second contact surface dimensioned and configured differently than the first contact surface to provide an efficient thermal contact with a correspondingly dimensioned and/or configured second type of substrate. The first and second faceplates are alternatively mountable to the backplane base to form a mated configuration therewith for alternatively processing the first and second types of substrates, respectively, in the vacuum chamber. The backplane assembly may be reconfigured by exchanging the first and second faceplates so that the substrate processing system can process the two different types of substrates. Additional faceplates may be provided to permit the substrate processing system to process more than two types of substrates, wherein each type of substrate has a differing dimension and/or configuration.

Embodiments of the backplane assembly of the present invention may be provided in the form of a retrofit kit that includes a backplane base and at least two interchangeable faceplates configured to collectively replace the conventional one-piece backplane used in certain substrate processing systems. Each of the faceplates in the retrofit kit is dimensioned and configured to be compatible with a correspondingly dimensioned and/or configured substrate so that the processing system can be adapted to process differently dimensioned and/or configured substrates.

According to the present invention, a method is provided for processing substrates of different configurations and/or dimensions on a sequential basis in a substrate processing system incorporating a ventable vacuum chamber with an access port. A backplane assembly is provided having a backplane base mounted in the vacuum chamber with a position suitable for processing substrates, a first faceplate removably mounted to the backplane base, and a second faceplate removably mountable to the backplane base when the first faceplate is demounted from the base. The first faceplate has a first contact surface dimensioned and configured to provide an efficient thermal contact with a first type of substrate. The second faceplate has a second contact surface dimensioned and configured to provide an efficient thermal contact with a second type of substrate which is configured and/or dimensioned differently than the first substrate. A first substrate is placed on the first faceplate and processed while the access port is closed and the vacuum chamber is under sub-atmospheric pressure. The access port in the vacuum chamber is opened to provide access to the first faceplate and the first substrate is removed. The first faceplate is removed from the backplane base without removing the backplane base from the vacuum chamber. The first faceplate is removed through the open access port and the second faceplate is inserted into the access port through the open access port. The second faceplate is then mounted to the backplane base without removing the backplane base from the vacuum chamber. A second substrate is placed on the second faceplate and processed while the access port is closed and the vacuum chamber is under sub-atmospheric pressure.

By virtue of the foregoing, there is provided a backplane assembly that increases the operational efficiency of a substrate processing system by reducing the complexity of the system and minimizing the cost and downtime when the system is retooled for processing substrates of a different dimension and/or configuration. The present invention provides backplane assemblies having a backplane base that is mountable to the vacuum chamber and two or more removable faceplates that are mountable to the backplane base without removing the backplane base from the processing chamber. Each of the faceplates has a contact surface dimensioned and configured to accommodate a correspondingly dimensioned and/or configured substrate to comply with a change in the type of substrate being processed by the substrate processing system. The present invention is compatible with, and can be retrofitted to, substrate processing systems of the prior art that lack such a capability for rapid and simple reconfiguration to reflect a change in the dimension and/or configuration of the substrates being processed.

These and other objectives and advantages of the present invention will be more readily apparent from the following detailed description.

DETAILED DESCRIPTION

The environment of the present invention is a substrate processing station of a semiconductor processing system, such as a substrate processing station or module configured to perform a physical vapor deposition of a coating material onto the surface of a semiconductor substrate. Although the present invention is also applicable to other types of semiconductor processing systems, the described embodiment is particularly suited for high throughput carrousel-type semiconductor processing systems of the types illustrated and described in U.S. Pat. Nos. 4,915,564 or 5,516,732, both expressly incorporated by reference in their entirety herein.

Figure 1:
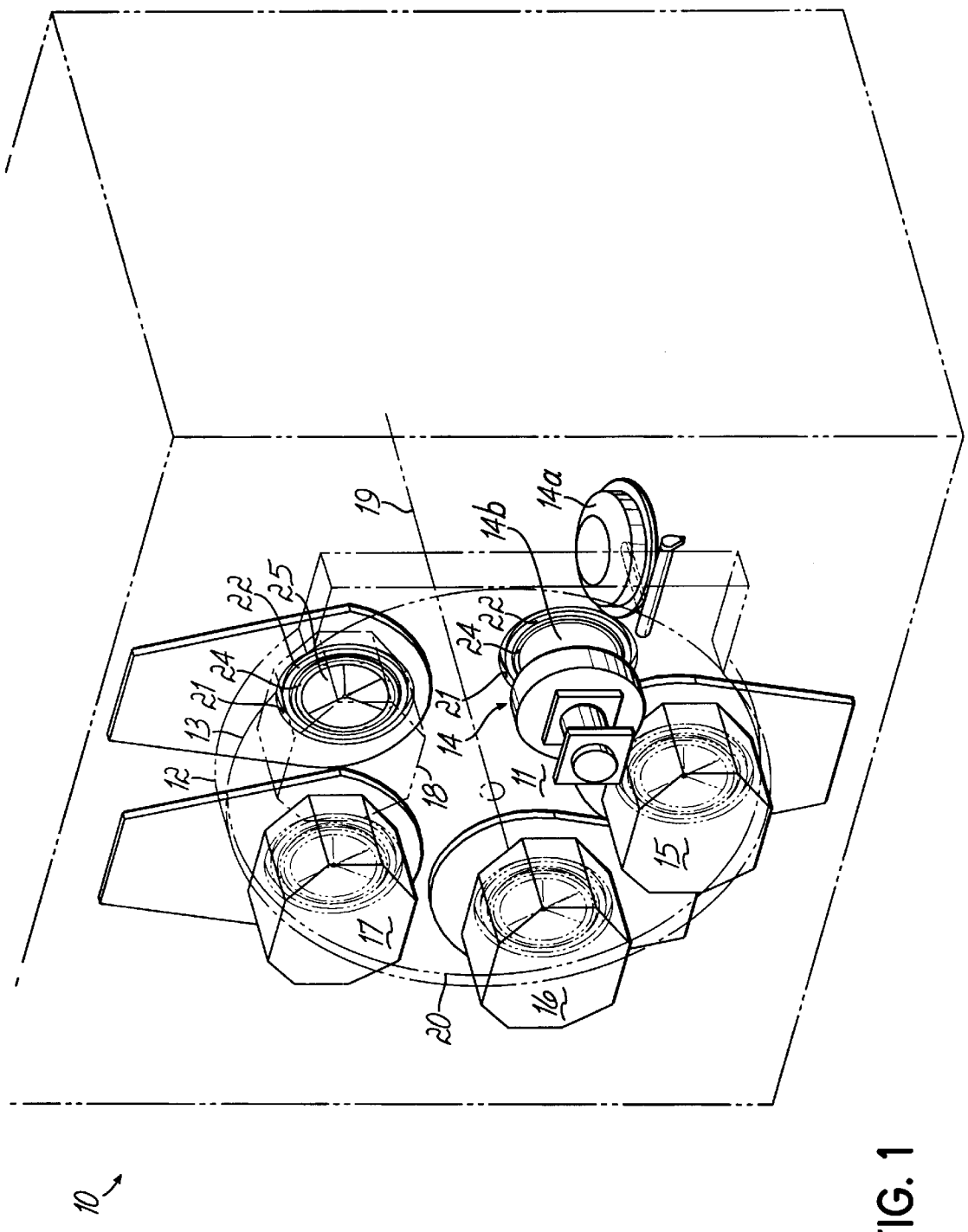
FIG. 1 is an elevational cross-sectional view of a portion of a semiconductor processing system incorporating backplane assemblies according to the present invention.

With reference to FIG. 1, the substrate or semiconductor processing system 10 generally includes a main vacuum chamber 11, which has the form of a cylindrical plenum enclosed between a pair of generally disk-shaped chamber walls 12, 13. Vacuum chamber 11 is provided with a controlled sub-atmospheric or vacuum environment for performing certain substrate processing operations. A plurality of, for example, five process modules 14–18 is spaced with equal angular intervals around a horizontal central axis 19. Within the main vacuum chamber 11, a disk-shaped index plate 20 is mounted for rotation about the axis 19 relative to the chamber walls 12, 13. Five circular openings 21 extend through the index plate 20 at equal angular intervals about axis 19 for simultaneously alignment, when properly indexed by rotation of plate 20 about axis 19, with respective ones of the process modules 14–18. A substrate holder 22 in is provided in each opening 21 for securing a substrate 23 (FIG. 2) with a generally vertical orientation therein. The substrate holder 22 cooperates with an annular clamp ring 24 and a clamping structure (not shown), such as a plurality of selectively positionable latches, for grasping and securing an annular peripheral rim of the substrate 23. At least one of the five process modules 14–18, for example, module 14, is a loadlock chamber having a sealable loadlock door 14a which, when opened, exposes an opening 14b through which substrates 23 can be inserted into and removed from the main vacuum chamber 11 by a substrate handling subsystem (not shown) of processing system 10. The remaining process modules 15–18 are equipped as substrate processing stations for performing substrate processing steps, such as physical vapor deposition and plasma cleaning. Substrates 23 are loaded by the substrate handling subsystem through the opening 14b into the loadlock chamber 14, secured in substrate holders 22, and rotated by the index plate in carrousel-type fashion so that the process modules 15–18 can perform successive substrate processing steps, which are completed when each substrate 23 is returned to the loadlock chamber 14.

Associated with each of the process modules 15–18 is a backplane assembly 25 adapted to selectively contact the rear face of substrate 23 when the appropriate opening 21 is indexed to an angular position operable for a substrate processing step. The backplane assembly 25, when in contact with the substrate 23 held by substrate holder 22, is operable for regulating the temperature of the substrate 23 during processing by the appropriate one of the process modules 15–18 of semiconductor processing system 10.

Figure 2:
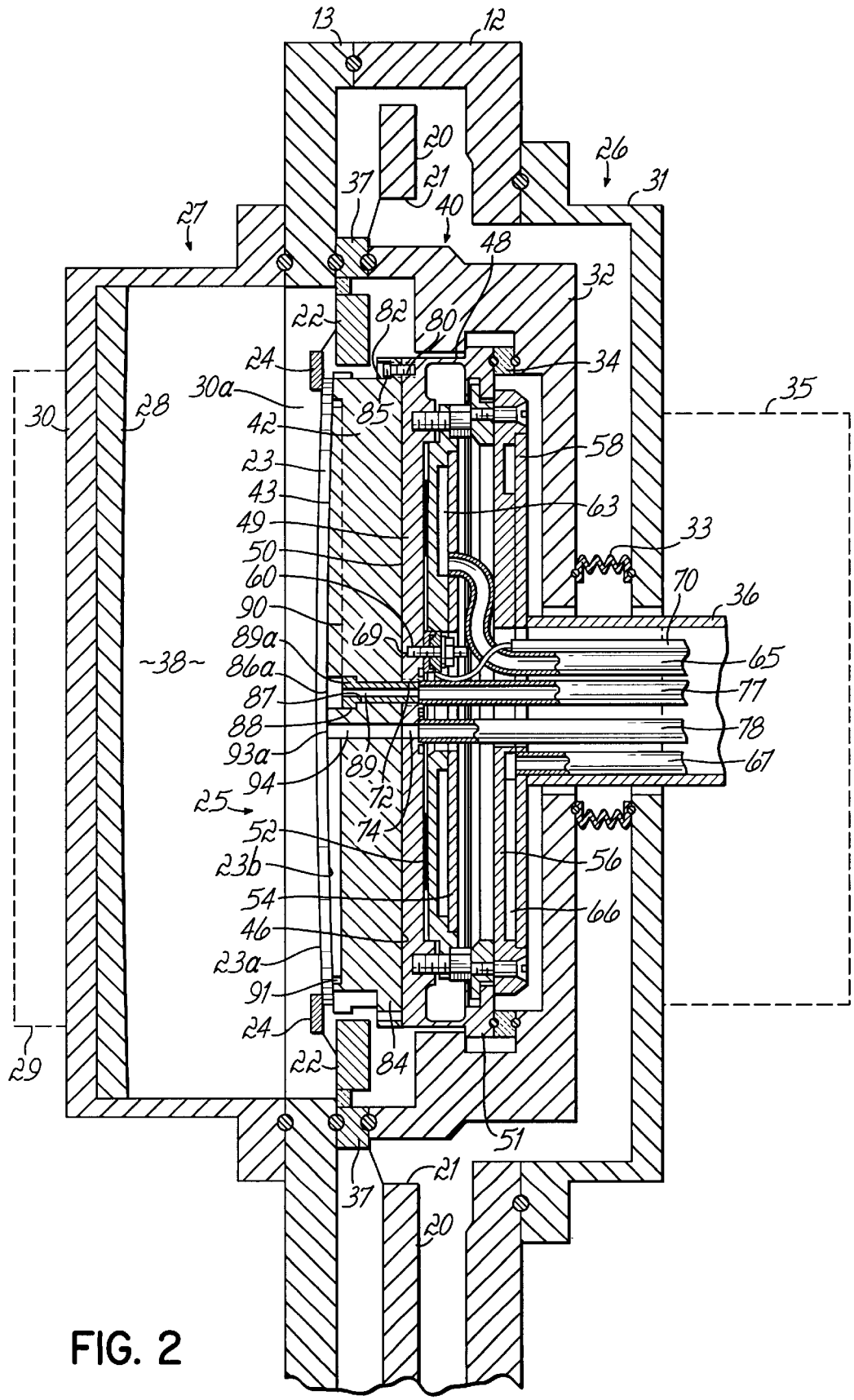
FIG. 2 is an elevational cross-sectional view of a portion of the system of FIG. 1 illustrating one of the backplane assemblies having its faceplate engaged with a substrate.

With reference to FIG. 2, the backplane assembly 25 of present invention is illustrated in its extended operating position inside a backplane section 26 of one of the process modules 15–18, for example, process module 18 and in contact with substrate 23 held by the clamp ring 24. The process module 18 is divided into the backplane section 26 and a frontplane section 27. The frontplane section 27 includes a source of a coating material, such as a sputtering target 28 and a cathode assembly 29 operably connected to sputtering target 28 for performing a physical vapor deposition of a coating material onto an exposed face 23a of substrate 23. The sputtering target 28 is enclosed within a cup-shaped module wall 30, which is removably attached and sealed in a vacuum-tight fashion to an access port 30a provided in chamber wall 13. The exposed face 23a of the substrate 23 has a generally confronting relationship with the sputtering target 28. The backplane section 26 includes a mounting adapter 31 covering an opening provided in chamber wall 12 and a linearly moveable cup-shaped chamber cover 32 sealed to the mounting adaptor 31 by a plenum conduit, illustrated in FIG. 2 as a bellows assembly 33. The chamber cover 32 houses the backplane assembly 25 in an electrically-insulated and vacuum-sealed fashion due to the interposition of an annular ceramic insulating seal ring 34. The chamber cover 32 is operably attached to a drive piston 36 of a linear actuator, such as an electro-pneumatic or air cylinder 35, for selective reciprocating linear movement toward and away from the frontplane section 27. When a substrate holder 22 carrying a substrate 23 is rotationally indexed for positioning in the opening 21 of, for example, process module 18, the air cylinder 35 is actuated to move chamber cover 32 into a sealed engagement with a seal ring 37. The substrate holder 22, clamp ring 24 and seal ring 37 are resiliently biased, such as by leaf springs, with respect to the index plate 20 and collectively deflect when the air cylinder 35 is actuated to apply a substantially linear force for moving the chamber cover 32 toward the frontplane section 27 and substrate 23 held by substrate holder 22. The seal ring 37 is sealingly captured between the chamber wall 13 of the main vacuum chamber 11 and the chamber cover 32 to define a sealed vacuum processing space 38 which is enclosed by the chamber cover 32 and the frontplane section 27. To that end, the seal ring 37 is equipped with O-rings 39 arranged in a circular pattern concentric with circular openings provided in the chamber wall 13 and the chamber cover 32 so as to aid in sealing the sandwich arrangement of elements. The vacuum processing space 38 is substantially isolated from the controlled vacuum environment of the main vacuum chamber 11 so that the processing step transpires in process module 18.

Figure 3:
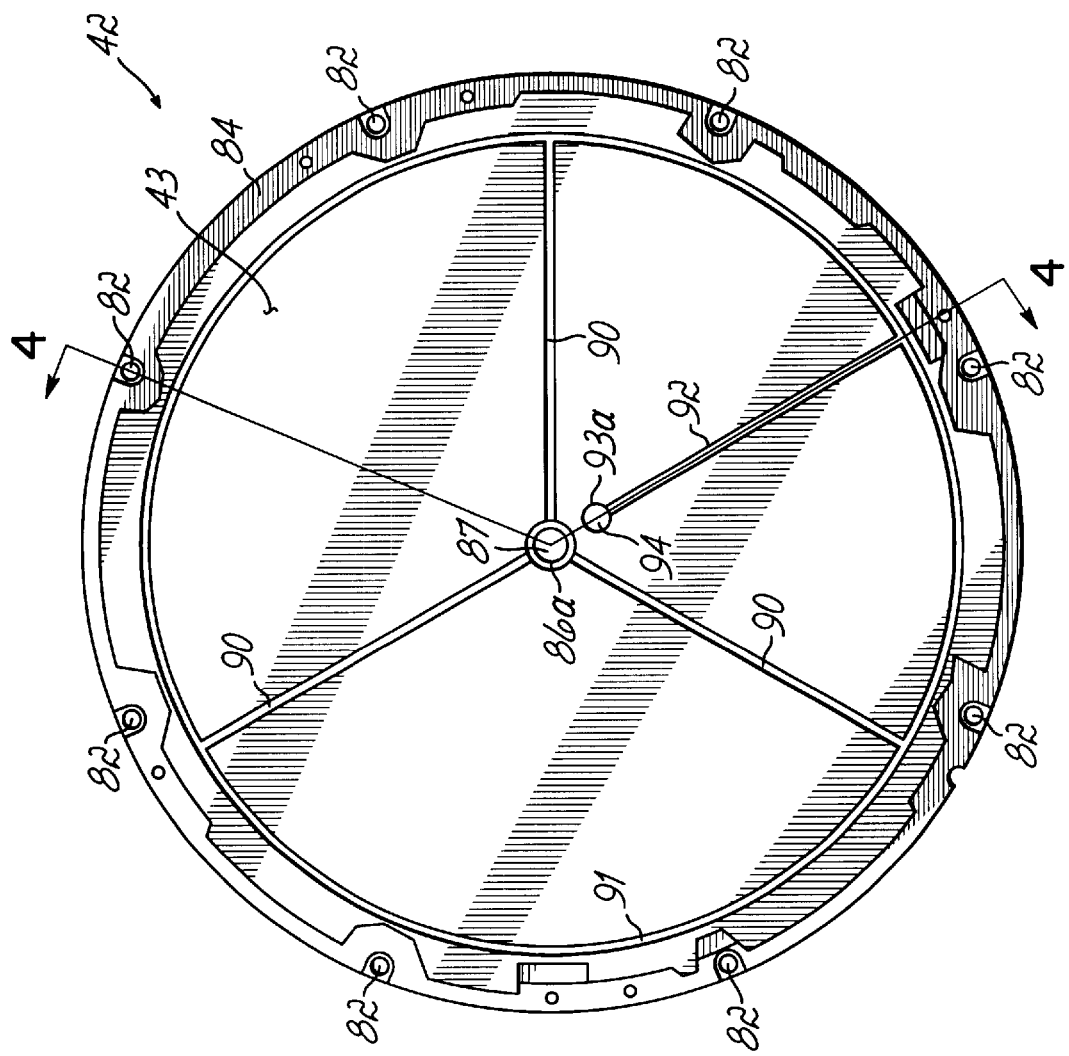
FIG. 3 is an end perspective view of the faceplate of FIG. 2.

With reference to FIGS. 2 and 3, the backplane assembly 25 of the present invention includes a backplane base 40 and a faceplate 42 that is removably mounted to the backplane base 40. Faceplate 42 is sized to be insertable through the access port 30a, when frontplane 27 is detached, for removably mounting faceplate 42 to the backplane base 40. Faceplate 42 has a contact surface 43 that physically contacts, or is positioned proximate to, a rear face 23b of the substrate 23 when the chamber cover 32 is actuated to the sealing position. The contact surface 43 is dimensioned and configured to engage substrates 23 of a corresponding dimension and/or configuration. As the chamber cover 32 moves into a sealing position with seal ring 37, as shown in FIG. 2, the contact surface 43 contacts the rear face 23b of the substrate 23 held between the substrate holder 22 and clamp ding 24 and, thereby, establishes proximity or a direct contact effective for efficient heat conduction between the backplane assembly 25 and the substrate 23. The bellows assembly 33 extends and contracts linearly to accommodate the substantially linear movement of the backplane assembly 25 for establishing the proximity or direct contact between the contact surface 43 and the rear face 23b of the substrate 23 while maintaining the integrity of the vacuum within the main vacuum chamber 11. Faceplate 42 has a flat, disk-shaped mating surface 46 that is on the opposite side of faceplate 42 from the contact surface 43.

The backplane base 40 includes a hollow generally-cylindrical base housing 48 having a platen portion 49. The backplane base 40 has a cylindrical flange 51 which is mounted using seal ring 34 to a recess provided in the chamber cover 32. A flat, disk-shaped mating surface 50 of the platen portion 49 is adapted to attach to and provide a close contact with the mating surface 46 when faceplate 42 is mounted to the backplane base 40. When faceplate 42 is mounted to backplane base 40 as shown in FIG. 2, the mating surfaces 46, 50 are substantially parallel and substantially coextensive. As a result, the mating surfaces 46, 50 have a substantially direct and continuous physical contact, or an intimate physical proximity, effective to promote the efficient transfer of heat energy, preferably by thermal conduction, between the backplane base 40 and the faceplate 42.

Figure 4:
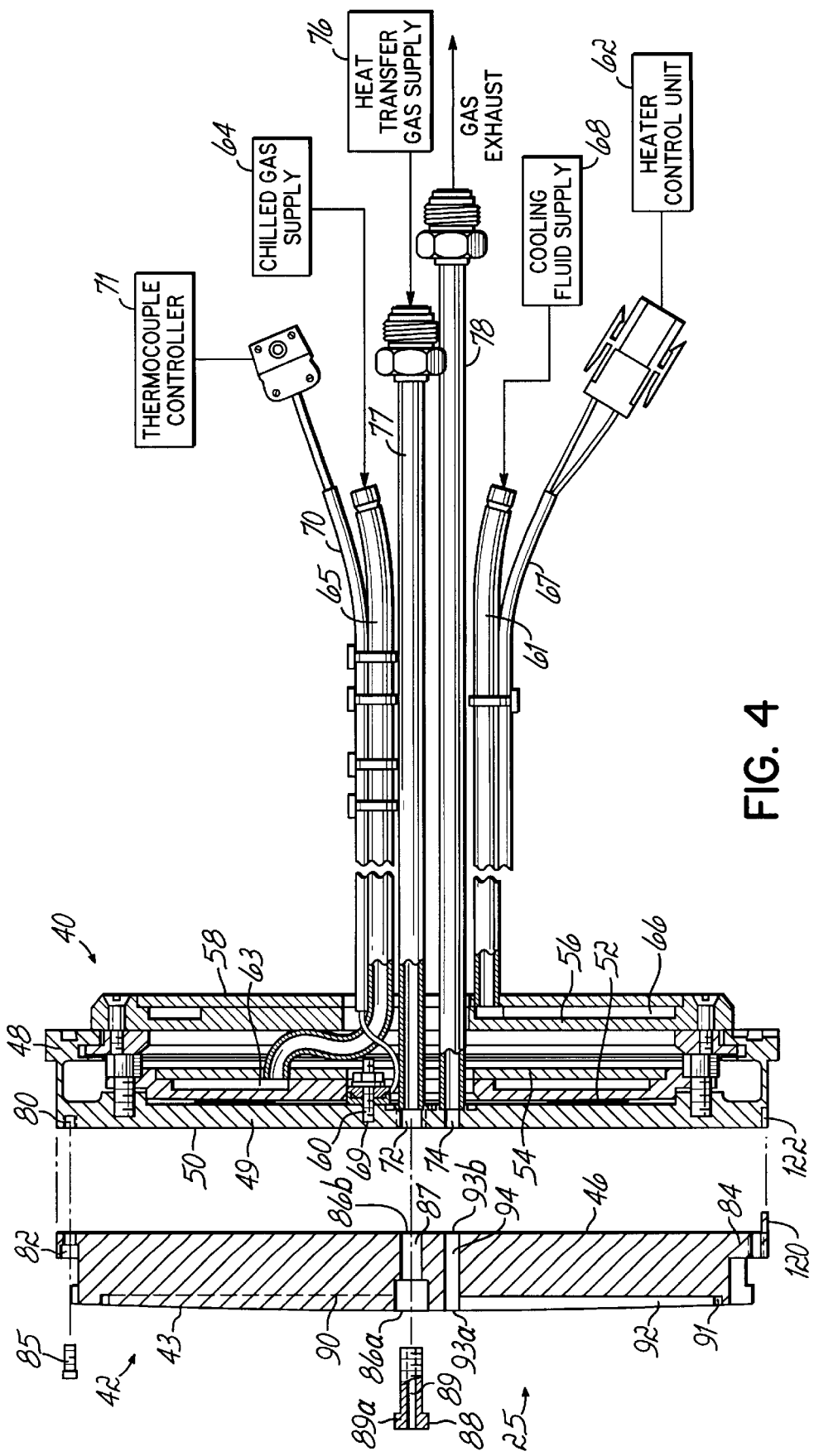
FIG. 4 is an exploded schematic cross-sectional view taken generally along line 4—4 of FIG. 3.

With reference to FIGS. 2 and 4, the backplane base 40 further includes a heater element 52 for heating the faceplate 42 and substrate 23, a chilled-gas cooling plate 54 for rapidly cooling the heater 52 and backplane base 40, a water cooling plate 56 for cooling a backside flange 58, and a thermocouple sensor 60 that detects the temperature of the portion of the platen portion 49 proximate the rear face of substrate 23. The heater element 52 and cooling plates 54, 56 are positioned within the interior of the base housing 48 and attached thereto with conventional fasteners.

The heater element 52 is captured in an electrically-insulated manner between the base housing 48 and the chilled-gas cooling plate 54. The heater element 52 may be a resistance heater having the form of an embedded foil or plate or another suitable form or shape. Heat energy is transferred by thermal conduction from the heater element 52 through the platen portion 49 of the base housing 48 and the faceplate 42 to elevate the temperature of the contact surface 43. Heat energy is subsequently transferred from the contact surface 43 to the substrate 23 preferably by thermal conduction, when the rear face 23b of substrate 23 is engaged by contact surface 43. A power transmission cable 61 couples the heater element 52 to a conventional heater control unit 62, for example, such as a heater control unit having a power supply operating at 120 Volts AC and a duty cycle controlled by a silicon controlled rectifier (SCR), that regulates the electrical current flowing to heater element 52. The electrical current flowing to resistance heater 52 is converted to thermal energy or heat energy for heating the substrate 23 to a desired processing temperature. The heater element 52 is operable for heating the substrate 23 to a processing temperature between ambient temperature and, for example, about 550° C.

The chilled-gas cooling plate 54 is positioned between the water-cooling plate 56 and the heater element 52. The chilled-gas cooling plate 54 has a cavity 63 that receives a flow of a chilled gas, such as cooled nitrogen, selectively supplied by a chilled gas source 64 via a chilled gas line 65.

The flow of chilled gas is employed to rapidly cool the heater element 52 from the desired processing temperature to a temperature near ambient temperature so that the backplane assembly 25 can be withdrawn to permit rotation of the index plate 20. The rapid cooling provided by the chilled-gas cooling plate 54 expedites the repositioning of substrates 23 within vacuum chamber 11 following processing steps and, thereby, improves throughput of the semiconductor processing system 10.

The water cooling plate 56 regulates the temperature of the backside flange 58, which is exposed to the ambient atmosphere surrounding the semiconductor processing system 10 and which is heated by the operation of heater element 52. To that end, a cavity 66 is defined between the backside flange 58 and the water cooling plate 56. The cavity 66 has an inlet sealed to a cooling tube 67 for providing a flow of a cooling fluid, such as water, adjacent to the backside flange 58. The cavity 66 extends around the periphery of the backside flange 58 for maintaining flange 58 at a sufficiently low temperature to avoid degradation. Cooling tube 67 is coupled to a suitable cooling fluid supply 68.

The thermocouple sensor 60 is attached to the base housing 48 at a position near the mid-point of the platen portion 49. A tip 69 of the sensor 60 is embedded within the material of the base housing 48 and lies just beneath the plane of the mating surface 50.

A pair of electrically-insulated thermocouple leads 70 extend from a secure attachment with the thermocouple sensor 60 to a thermocouple controller 71. The thermocouple sensor 60 detects the temperature of the platen portion 49 of the base housing 48 near the rear face of substrate 23, which approximates the actual temperature of the substrate 23. The detected temperature is compared with a predetermined temperature at which the substrate 23 is to be maintained during processing. Deviations from the predetermined temperature can be compensated by adjusting the electrical current provided by heater control unit 62 to the heater element 52.

Extending through the platen portion 49 of the base housing 48 and perforating the mating surface 50 are a heat transfer gas inlet passageway 72 and a heat transfer gas exhaust passageway 74 which facilitates a flow of a heat transfer gas, for purposes to be discussed below. The heat transfer gas is supplied from a heat transfer gas supply 76 coupled to the heat transfer gas inlet passageway 72 through a gas-supply conduit 77. The heat transfer gas inlet exhaust passageway 74 has an outlet sealed to a gas-exhaust conduit 78 for exhausting the flow of the heat transfer gas less any heat transfer gas lost from beneath the substrate 23 to the vacuum processing space 38. The heat transfer gas is utilized to promote efficient heat transfer from the contact surface 43 of the faceplate 42 to the substrate 23.

The power transmission cable 61, chilled gas line 65, cooling tube 67, thermocouple leads 70, gas-supply conduit 77 and gas-exhaust conduit 78 couple with the backplane assembly 25 through the hollow interior of the drive piston 36 of the air cylinder 35. The drive piston 36 is surrounded by the bellows assembly 33 for isolation from main vacuum chamber 11.

With reference to FIGS. 3 and 4, the backplane base 40 and the faceplate 42 include complementary fastening structures for securing the faceplate 42 to the backplane base 40. As best shown in FIG. 4, a plurality of, for example, eight internally-threaded bolt holes 80, of which one bolt hole 80 is shown, are arranged in a circle about the outer periphery of the platen portion 49 of the backplane base 40. The bolt holes 80 have approximately equal angular spacings with respect to the center of the mating surface 50. As best shown in FIG. 4, a plurality of, for example, eight through-holes 82 is disposed in a circular pattern about a circumference of an outer peripheral flange 84 encircling the faceplate 42. Each through-hole 82 extends through the axial dimension or thickness of the outer peripheral flange 84. Adjacent pairs of through-holes 82 preferably are spaced with uniform angular spacings relative to the center of the mating surface 46. Preferably, the number of through-holes 82 and bolt holes 80 correspond and the angular spacing of the through-holes 82 is substantially equal to the angular spacing of the bolt holes 80. When the faceplate 42 has a proper rotational orientation with respect to the backplate base 40, as will be explained below, the through-holes 82 are substantially aligned with the bolt holes 80 such that vented mounting bolts 85 can be used in fastening or mounting the faceplate 42 to the backplane base 40. It is understood by persons of ordinary skill in the art that the bolt holes 80 and the through-holes 82 may have an irregular angular spacing or be disposed with a non-circular pattern, consistent with permitting rotational alignment of bolt holes 80 and through-holes 82 for at least one angular orientation of faceplate 42 relative to backplane base 40.

With reference to FIGS. 3 and 4, a stepped-diameter gas inlet port 87 extends through the thickness of the faceplate 42 from the contact surface 43 to the mating surface 46. The gas inlet port 87 has a first open end 86*a* proximate the center of the contact surface 43 and a second open end 86*b* proximate the mating surface 46. A vented mounting bolt 88 is received within the first open end 86*a* and has a threaded exterior portion that engages complementary threads disposed within the small-diameter bore of the gas inlet port 87 for assisting in fastening or mounting the faceplate 42 to the backplane base 40. A central gas passageway 89 is provided along the length of the vented mounting bolt 88 and communicates with the gas inlet port 87. The head 89*a* of the vented mounting bolt 88 is dimensioned to fit within the large-diameter bore of the gas inlet port 87 such that head 89*a* does occlude or block fluid flow out of the gas inlet 86 port 87.

Due to surface imperfections and other surface irregularities, substantial areas of the rear face 23*b* of the substrate 23 and the contact surface 43 of faceplate 42 are not in direct physical contact, which reduces the uniformity of the heat transfer and may produce significant temperature variations across the exposed face 23*a* of the substrate 23. To ensure that the substrate 23 has uniform temperature distribution, a flow of the heat transfer gas, such as argon, is provided proximate from heat transfer gas supply 76 to the rear face 23*b* of the substrate 23. The heat transfer gas improves the heat transfer between the contact surface 43 and the rear face 23*b* of substrate 23 for abutting areas not in direct physical contact so as to provide for more uniform and efficient heating of the substrate 23.

To that end and with continued reference to FIGS. 3 and 4, the contact surface 43 of faceplate 42 includes a plurality of, for example, three connecting gas inlet channels 90 communicating with the first open end 86*a* of gas inlet port 87, a peripheral gas channel 91, and a connecting gas exhaust channel 92 communicating with a gas exhaust port 94. The channels 90, 91 and 92 are embossed in relief below the contact surface 43. The peripheral gas channel 91 encircles an outer circumference of the contact surface 43 peripherally inside the outer rim of surface 43. The connecting gas inlet channels 90 are spaced at substantially equal angular intervals about the contact surface 43 relative to the gas inlet port 87 and extend radially from the peripheral gas channel 91. The connecting gas exhaust channel 92 extends radially from the peripheral gas channel 91 to a first open end 93a of a gas exhaust port 94.

The gas exhaust port 94 extends through the thickness of the faceplate 42 from the contact surface 43 to the mating surface 46 and terminates with a second open end 93b. The gas exhaust port 94 is radially offset from the central location of the gas inlet port 87. The channels 90, 91 and 92 are in common fluid communication to provide a flow path for heat transfer gas from the gas inlet port 87 to the gas exhaust port 94, when substrate 23 is positioned on the contact surface 43. The heat transfer gas flowing from the gas inlet port 87 is distributed into each of the radial inlet channels 90 for delivering the heat transfer gas to the contact surface 43 and proximate the rear face 23b of substrate 23. Heat transfer gas is drained by the connecting gas exhaust channel 92 to the gas exhaust port 94. When the face plate 42 is positioned for mounting to the backplane base 40 with a proper rotational orientation and the bolt holes 80 aligned with the through-holes 82, the second open end 86b of the gas inlet port 87 is substantially aligned with and in communication with the heat transfer gas inlet passageway 72 of the backplane base 40 and the second open end 93b of the gas exhaust port 94 is aligned and in communication with the heat transfer gas exhaust passageway 74 of the backplane base 40. It is understood by those of ordinary skill in the art that the channels 90, 91 and 92 may have a different arrangement, or pattern, within and extending about the contact surface 43. It will also be appreciated that the gas exhaust port 94 and at least the connecting gas exhaust channel 92 may be eliminated such that any exhausted heat transfer gas is vented from beneath substrate 23 into the vacuum processing space 38.

The heat transfer gas is supplied from the heat transfer gas supply 76 at a precision-controlled gas pressure ranging from about 1 Torr to about 8 Torr and at a flow rate between about 10 standard cubic centimeters per minute (sccm) and about 200 sccm, depending on the vacuum pressure in the vacuum processing space 38 (FIG. 2). The force due to the gas pressure causes the heat transfer gas to vent from underneath the edge of substrate 23 at a leakage rate proportional to the flow rate and the conformity between substrate 23 and the contact surface 43. The leakage rate of heat transfer gas may be, for example, about 20 sccm for a flow rate of about 100 sccm. The heat transfer gas that leaks from beneath the substrate 23 is evacuated from the vacuum processing space 38.

The rear face 23b of substrate 23 substantially abuts the contact surface 43 of faceplate 42, except in portions of the surface 43 that incorporate channels 90, 91 and 92. The contact surface 43 preferably has a convex shape which creates a hemispherical crown that drops from the center of surface 43 toward an outer edge thereof. For example, the contact surface 43 of the faceplate 42 may have a crown of about 0.0260 inches for a faceplate configured and dimensioned with a 6-inch-diameter circular contact surface and a crown of about 0.0404 inches for a faceplate 42 configured and dimensioned with an 8-inch-diameter circular contact surface. When the backplane assembly 25 extends to cause the seal ring 37 to be sealingly captured between the chamber cover 32 and the chamber wall 13, a substantially linear force is applied by the backplane assembly 25 to the substrate 23 so the substrate 23 flexes and the rear face 23b of the substrate 23 substantially conforms to the convex curvature of the contact surface 43.

In accordance with the present invention, the faceplate 42 may be quickly and readily removed from the backplane base 40 and replaced as necessary with another faceplate, such as a faceplate 44 (FIGS. 5 and 6), which has a contact surface 45 dimensioned and configured to accept substrates 23 of a corresponding dimension and/or configuration. The contact surface 45 of faceplate 44 is dimensioned and configured differently from the contact surface 43 of faceplate 42. In that way, a substitute faceplate, such as the faceplate 44, can be rapidly installed without removing the backplane base 40, thus reducing the expense and downtime associated with conforming the substrate processing system 10 to a change in the dimension and/or configuration of the substrates 23 being processed.

Figure 6:
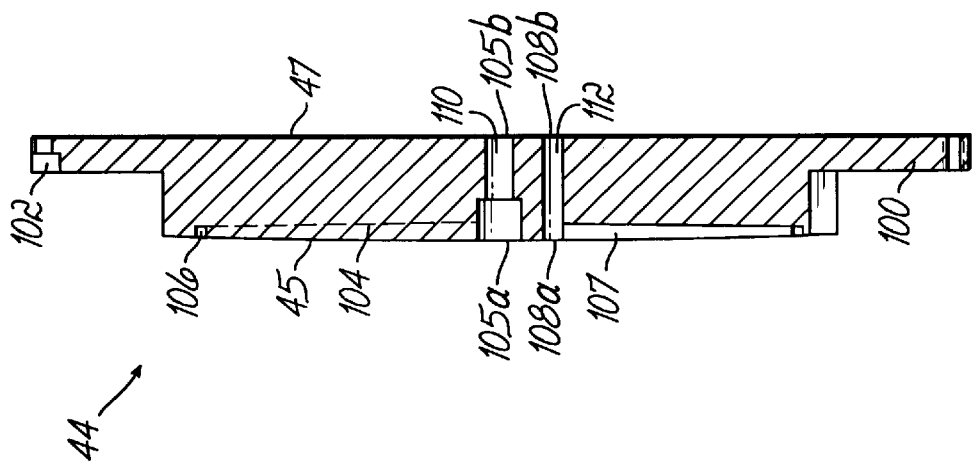
FIG. 6 is a cross-sectional view taken generally along line 6—6 of FIG. 5.
Figure 5:
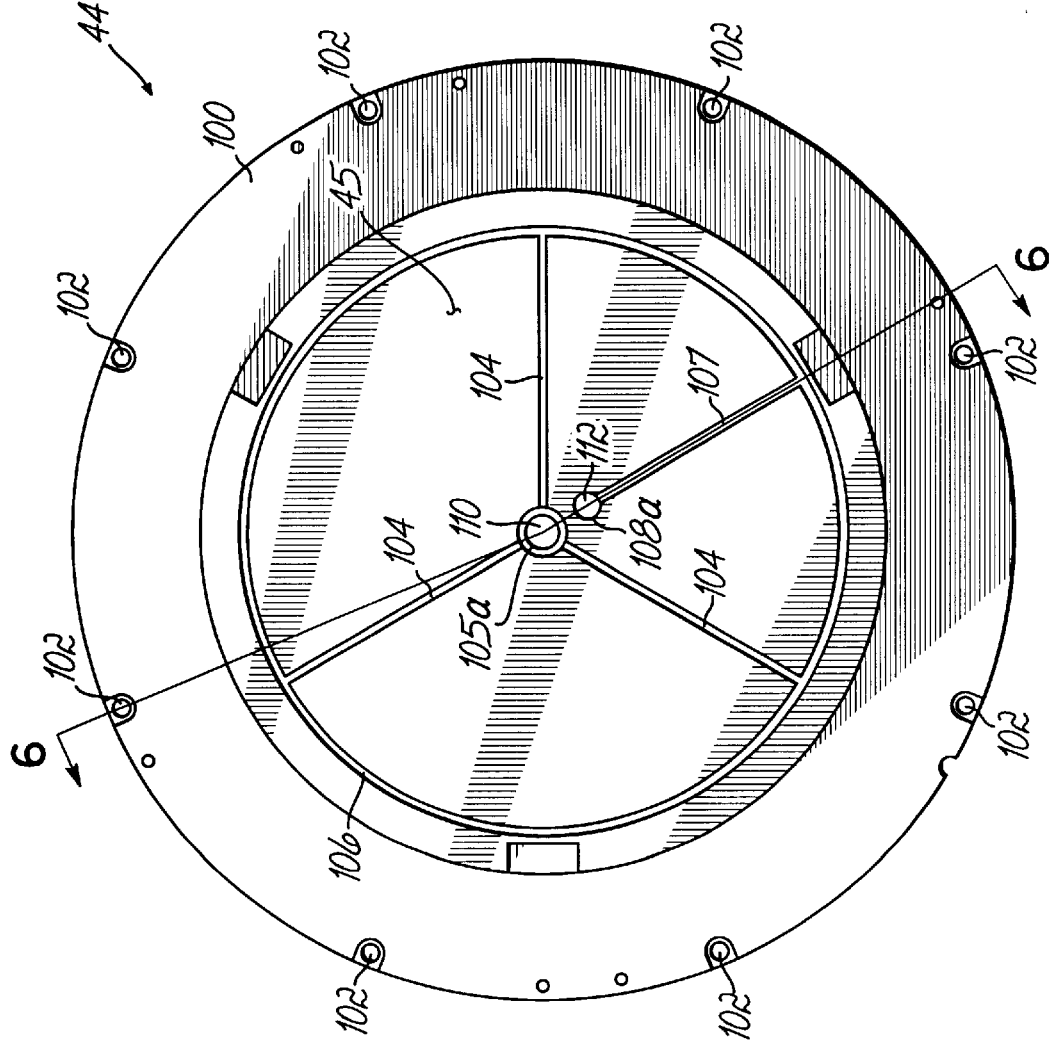
FIG. 5 is an end perspective view illustrating a faceplate that can be interchanged with the faceplate of FIG. 2 for use, in the alternative, with the backplane assembly of the present invention.

With reference to FIGS. 5 and 6, faceplate 44 is mountable to the backplane base 40, as a substitute or replacement for faceplate 42 (FIGS. 3 and 4), without removing backplane base 40 from its mounted location within the vacuum chamber 11. Faceplate 44 is sized to be insertable through the access port 30a, when frontplane 27 is detached, for removably mounting faceplate 44 to the backplane base 40. The contact surface 45 of faceplate 44 physically contacts, or is positioned proximate to, the rear face 23b of the substrate 23 for efficient heat transfer when the chamber cover 32 is actuated to the sealing position, as described above with reference to faceplate 42. The contact surface 45 preferably has a hemispherical convex shape which creates a crown that drops from the center of surface 45 toward an outer edge thereof. Substrate 23 curves to conform to the curvature of the crown when engaged by the contact surface 45, as discussed above with regard to contact surface 43 of faceplate 42 (FIG. 4).

Faceplate 44 has a flat, disk-shaped mating surface 47 disposed on the opposite side of faceplate 44 from the contact surface 45. When faceplate 44 is mounted to the backplane base 40, the mating surfaces 47 and 50 have a substantially direct and continuous physical contact, or close proximity, that effectively promotes efficient heat transfer, preferably by conduction, between the backplane base 40 and the faceplate 44.

Faceplate 44 is encircled by an outer peripheral flange 100, which is perforated by a plurality of, for example, eight through-holes 102. The plurality of through-holes 102 has a uniform angular spacing about flange 100 relative to the center of the contact surface 45. The through-holes 102 are positioned about the outer peripheral flange 100 in a pattern that corresponds to the location of the bolt holes 80 on the backplane base 40 so that the through-holes 102 and bolt holes 80 are aligned for at least one relative rotational orientation of faceplate 44 and backplane base 40. Preferably, the number of through-holes 102 and bolt holes 80 (shown in FIG. 4) correspond and the angular spacing of the through-holes 102 is substantially equal to the angular spacing of the bolt holes 80. When the faceplate 44 has a proper rotational orientation with respect to the backplate base 40, as will be explained below, the through-holes 102 are substantially aligned with the bolt holes 80 so as to permit vented mounting bolts 85 (shown in FIG. 4) to be inserted into the through-holes 102 and threadingly received by the bolt holes 80 for fastening or mounting faceplate 44 to the base housing 48 of backplane base 40.

Similar to contact surface 43 (FIG. 3), the contact surface 45 includes a plurality of, for example, three connecting gas inlet channels 104 communicating with an open first end 105a of a stepped-diameter gas inlet port 110, a peripheral gas channel 106, and a connecting gas exhaust channel 107 communicating with an open first end 108a of a gas exhaust port 112. The channels 104, 106, and 107 are embossed in relief below the contact surface 45. The channels 104, 106, and 107 collectively provide a flow path for heat transfer gas from the open first end 105a of the gas inlet port 110 to an open first end 108a of the gas exhaust port 112, when substrate 23 is positioned on the contact surface 45. The gas inlet port 110 is configured and dimensioned to threadingly receive the vented mounting bolt 88 (FIG. 4) without occluding or blocking the fluid path from the gas inlet port 110 to the connecting gas inlet channels 104. The gas exhaust port 112 provides an exhaust for the flow of the heat transfer gas. The gas inlet port 110 and gas outlet port 112 extend though the faceplate 44 from the contact surface 45 to the mating surface 47. When the face plate 44 is mounted to the backplane base 40 with a proper rotational orientation that aligns the bolt holes 102 with the through-holes 82, a second open end 105b of the gas inlet port 110 is substantially aligned with, and in communication with, the heat transfer gas inlet passageway 72 of the backplane base 40 (shown in FIG. 4) and a second open end 108b of the gas exhaust port 112 is aligned and in communication with the heat transfer gas exhaust passageway 74 of the backplane base 40 for establishing the flow of the heat transfer gas from heat transfer gas supply 76 to proximate rear face 23b of the substrate 23. When engaged therewith, the rear face 23b of substrate 23 abuts the contact surface 45 of faceplate 44, except in portions of the surface 45 that incorporate channels 104, 106, and 107. The flow of the heat transfer gas promotes efficient heat transfer from faceplate 44 to substrate 23 for those portions of contact surface 45 not in direct physical contact with the rear face 23b of substrate 23.

The pattern of through-holes 82 about the outer peripheral flange 84 and the pattern of through-holes 102 about the outer peripheral flange 100 are configured such that each of the faceplates 42, 44 can be removably mounted to the bolt holes 80 of the backplane base 40. The contact surface 45 of faceplate 44 differs in dimension and configuration from the contact surface 43 of faceplate 42 for processing substrates 23 of differing dimension and/or configuration. The contact surface 43 of faceplate 42, as best illustrated in FIG. 3, is substantially disk-shaped with a circular outer periphery and is dimensioned and configured to establish an effective thermal contact with a first type of substrate 23 having a corresponding dimension and/or configuration. As best illustrated in FIG. 5, the contact surface 45 of the faceplate 44 is substantially disk-shaped with a circular outer periphery and is dimensioned and configured to establish an effective thermal contact with a second type of substrate 23 having a corresponding dimension and/or configuration. For example, if the first and second types of substrates 23 are circular wafers having differing outer diameters, such as about 150 mm and about 200 mm, contact surface 43 will have an outer diameter equal to about 150 mm and contact surface 45 will have an outer diameter slightly equal to about 200 mm. However, the present invention is not so limited and the contact surfaces of the faceplates 42, 44 may be non-circular. For example, the contact surfaces 43, 45 may be rectangular and of different rectangular dimensions for processing substrate 23 of two different rectangular dimensions or configurations.

Face plate 42, faceplate 44, and the base housing 48 are constructed of a metal, such as a stainless steel alloy and, preferably, such as a 316 stainless steel alloy. The mating surfaces 46, 47 and 50 may be covered by a layer of a coating, such as electroless nickel, to provide relatively smooth surfaces which have significant direct contact or proximity when one of the mating surfaces 46, 47 is engaged with mating surface 50 for promoting efficient heat transfer.

It is understood that additional faceplates, similar to faceplates 42, 44, could be provided for removably mounting to backplane base 40 so that the backplane assembly 25 may be adapted to accept substrates 23 of more than two types, wherein each additional faceplate has a distinct dimension and configuration to match the dimension and/or configuration of each additional type of substrate 23 to be processed by semiconductor processing system 10. For example, five faceplates with contact surfaces having diameters of about 100 mm, 125 mm, 150 mm, 200 mm, and 300 mm could be provided for interchangeable mounting to backplane base 40 to permit the backplane assembly 25 to be selectively configured to accept types of substrates 23, such as silicon wafers, having outer diameters of 100 mm, 125 mm, 150 mm, 200 mm, and 300 mm, respectively.

In use, backplane assembly 25 of one of the process modules 15–18, for example, process module 18 is initially configured with, for example, faceplate 42 mounted with vented mounting bolts 85, 88 to the backplane base 40 so that mating surface 46 has a suitable thermal contact with mating surface 50. The second open end 93b of the gas exhaust port 94 is in communication with the heat transfer gas exhaust passageway 74 and the second open end 86b of the gas inlet part 87 is in communication with the heat transfer gas inlet passageway 72. Faceplate 42 has contact surface 43 which is dimensioned and configured to provide an efficient thermal contact, during processing, with substrates 23 of a corresponding first dimension and/or configuration. Substrates 23 of the first dimension and/or configuration are placed, as discussed above, on faceplate 42 to perform a processing step with the access port 30a closed and the main vacuum chamber 11 and the vacuum processing space 38 evacuated to a sub-atmospheric pressure. After the final one of the substrates 23 of the first dimension and/or configuration is processed and removed from the faceplate 42, the vacuum processing space 38 is vented and the frontplane section 27 is detached to reveal the access port 30a. Faceplate 42 is demounted from the backplane base 40 by unfastening the vented mounting bolts 85, 88 using a conventional fastening tool, such as a screwdriver or Allen wrench. Faceplate 42 is removed through the access port 30a while the backplane base 40 remains mounted to the vacuum chamber 11. Without removing backplane base 40, the faceplate 44, having contact surface 45 dimensioned and configured to provide an efficient thermal contact with substrates 23 of a differing second dimension and/or configuration than faceplate 42, is inserted into access port 30a. The mating surface 47 of faceplate 44 is positioned adjacent to the mating surface 50 of backplane base 40 and rotatably oriented such that the gas inlet port 110 is in communication with heat transfer gas inlet passageway 72 and the gas exhaust port 112 is in communication with heat transfer gas exhaust passageway 74 and the through-holes 102 are substantially aligned with the bolt holes 80. The rotational alignment of faceplate 44 with backplane base 40 can be accomplished, for example, with the assistance of an alignment fixture or matching alignment marks, or by the engagement of a pair of complementary locating elements 120, 122, such as a key and keyway or a pin and a hole, located on the faceplate 44 and backplane base 40, respectively. The vented mounting bolts 85 are inserted into the through-holes 102 and are threadingly fastened using the conventional fastening tool into the bolt holes 80 to mount faceplate 44 to backplane base 40 and to establish a suitable thermal contact between mating surface 47 and mating surface 50. Vented mounting bolt 88 is threadingly fastened within the gas inlet port 87. The frontplane section 27 is reattached to close and seal the access port 30a and the vacuum processing space 38 is evacuated to a sub-atmospheric pressure. After faceplate 44 is mounted, process module 18 is ready to process substrates 23 of a second dimension and/or configuration, which are placed on the contact surface 45 in the manner discussed above. The substrates 23 of the second dimension and/or configuration are processed while the access port 30a is closed and the main vacuum chamber 11 and the vacuum processing space 38 are evacuated to a sub-atmospheric pressure.

By way of comparison, replacement of a conventional backplane in substrate processing system 10 to conform to a change in the dimension and/or configuration of the substrates being processed would require, at the least, disconnecting the cables for the thermocouple controller and heater and the lines for all fluid supply systems, unbolting the conventional backplane from the chamber wall, installing the new conventional backplane, verifying the alignment and vacuum seal of the new conventional backplane, reconnecting the cables and lines to reestablish the fluid and electrical connections, and verifying the fluid-tightness of the reconnected lines and electrical continuity of the cables.

While the present invention has been illustrated by the description of embodiments thereof, and while the embodiments have been described in considerable detail, they are not intended to restrict or in any way limit the scope of the appended claims to such detail. Additional advantages and modifications will readily appear to those skilled in the art. For example, the backplane assembly of the present invention may be deployed in a substrate processing system in which the substrates are positioned in a horizontal plane, rather than an vertical plane, and the backplane assembly is vertically moveable for contacting the rear face of the substrate. The invention in its broader aspects is therefore not limited to the specific details, representative apparatus and method and illustrative examples shown and described. Accordingly, departures may be made from such details without departing from the scope or spirit of applicant's general inventive concept.

What is claimed is:

1. A backplane assembly for processing substrates of different configurations and/or dimensions on a sequential basis in a substrate processing system incorporating a ventable vacuum chamber with an access port, comprising:

a backplane base mountable within the vacuum chamber of the substrate processing system and at a position suitable for processing substrates, said backplane base including an inlet passageway for heat transfer gas;

a first faceplate sized to be insertable through the access port and removably mountable to said backplane base, said first faceplate having a first contact surface dimensioned and configured to provide an efficient thermal contact with a correspondingly dimensioned and/or configured first type of substrate, said first faceplate including a first inlet port coupled with the inlet passageway for directing heat transfer gas to the first contact surface when the corresponding said first faceplate is mounted to said backplane base to form the mated configuration;

a second faceplate sized to be insertable through the access port and removably mountable to said backplane base, said second faceplate having a second contact surface dimensioned and configured differently than said first contact surface to provide an efficient thermal contact with a correspondingly dimensioned and/or configured second type of substrate, said second faceplate including a second inlet port coupled with the inlet passageway for directing heat transfer gas to the second contact surface when said second faceplate is mounted to said backplane base to form the mated configuration, wherein said first faceplate and said second faceplate are alternatively mountable to said backplane base to form a mated configuration therewith for alternatively processing the first and second types of substrates, respectively, in the vacuum chamber; and a vented mounting bolt threadingly received within the inlet passageway and one of the first and second inlet ports for mounting the corresponding one of said first and second faceplates to the backplane base to form the mated configuration, said vented mounting bolt having a bore permitting heat transfer gas to flow from each of the first and second inlet ports to the corresponding one of the first and second contact surfaces.

2. The backplane assembly of claim 1, further comprising a third faceplate, sized to be insertable through the access port and removably mountable to said backplane base, said third faceplate having a contact surface uniquely dimensioned and configured to provide an efficient thermal contact with a correspondingly dimensioned and/or configured third type of substrate, wherein said first faceplate, said second faceplate, and said third faceplate are alternatively mountable to said backplane base to form a mated configuration therewith for alternatively processing the first, second and third types of substrates, respectively, in the vacuum chamber.

3. The backplane assembly of claim 1, further comprising a plurality of more than two faceplates; each sized to be insertable through the access port and removably mountable to said backplane base, each of said plurality of more than two faceplates having a contact surface uniquely dimensioned and configured to provide an efficient thermal contact with a correspondingly dimensioned and/or configured third type of substrate, wherein said plurality of more than two faceplates are alternatively mountable to said backplane base to form a mated configuration therewith for alternatively processing more than two types of substrates in the vacuum chamber.

4. The backplane assembly of claim 1, wherein:

said backplane base includes an exhaust passageway for heat transfer gas;

said first faceplate includes a first exhaust port coupled with the exhaust passageway for draining heat transfer gas from the first contact surface when said first faceplate is mounted to said backplane base to form the mated configuration and the first type of substrate is contacting the first contact surface; and said second faceplate includes a second exhaust port coupled with the exhaust passageway for draining heat transfer gas from the second contact surface when said second faceplate is mounted to the backplane base to form the mated configuration and the second the of substrate is contacting the second contact surface.

5. The backplane assembly of claim 4 wherein:

the first contact surface includes a first gas channel configured to direct the heat transfer gas between the first type of substrate and the first contact surface when the first type of substrate is contacting the first contact surface; and the second contact surface includes a second gas channel configured to direct heat transfer gas between the second type of substrate and the second contact surface when the second type of substrate is contacting the second contact surface.

6. The backplane assembly of claim 5, wherein:

the first gas channel includes a first peripheral gas channel extending about a perimeter of the first contact surface and a first connecting gas channel extending from the first gas inlet port to the first peripheral gas channel, and a second connecting gas channel extending from the first gas exhaust port to the first peripheral gas channel; and the second gas channel includes a second peripheral gas channel extending about a perimeter of the second contact surface, a third connecting gas channel extending from the second gas inlet port to the second peripheral gas channel, and a fourth connecting gas channel extending from the second gas exhaust port to the second peripheral gas channel.

7. The backplane assembly of claim 6, wherein:

the first contact surface has a circular outer rim, the first peripheral gas channel extends about a circumference of the outer rim, and the first and second connecting gas channels extend radially from the first gas inlet port to the first peripheral gas channel; and the second contact surface has a circular outer rim, the second peripheral gas channel extends about a circumference of the outer rim, and the third and fourth connecting gas channels extend radially to the second peripheral gas channel.

8. The backplane assembly of claim 1, wherein:

the first contact surface includes a first gas channel configured to direct heat transfer gas from the first gas inlet port between the first type of substrate and the first contact surface when the first type of substrate is contacting the first contact surface; and the second contact surface includes a second gas channel configured to direct heat transfer gas from the second gas inlet port between the second type of substrate and the second contact surface when the second type of substrate is contacting the second contact surface.

9. The backplane assembly of claim 8, wherein:

the first gas channel includes a first peripheral gas channel extending about a perimeter of the first contact surface and a first connecting gas channel extending from the first gas inlet port to the first peripheral gas channel; and the second gas channel includes a peripheral gas channel extending about a perimeter of the second contact surface and a second connecting gas channel extending from the second gas inlet port to the second peripheral gas channel.

10. The backplane assembly of claim 9, wherein the first contact surface has a circular outer rim, the first peripheral gas channel extends about a circumference of the outer rim, and the first connecting gas first gas inlet port to the first peripheral gas channel; and the second contact surface has a circular outer rim, the second peripheral gas channel extends about a circumference of the outer rim, and the second connecting gas channel extends radially from the second gas inlet port to the second peripheral gas channel.

11. The backplane assembly of claim 1, wherein:

said first faceplate includes a first mating surface opposite the first contact surface and a first fastening structure;

said second faceplate includes a second mating surface opposite the second contact surface and a second fastening structure; and the backplane base further comprises a third mating surface and a third fastening structure, wherein heat energy is transferred between the first and the third mating surfaces when the first faceplate is mounted to the backplane base and the first and third fastening structures are engaged and heat energy is transferred between the second and the third mating surfaces when the second faceplate is mounted to the backplane base and the second and third fastening structures are engaged.

12. The backplane assembly of claim 11, wherein:

said first faceplate includes a first flange encircling an outer periphery of the first mating surface and the first fastening structure comprises a plurality of first through-holes about the first flange;

said second faceplate includes a second flange encircling an outer periphery of the second mating surface and the second fastening structure comprises a plurality of second through-holes about the second flange;

the third mating surface comprises a plurality of the threaded holes, the plurality of first through-holes adapted to be alignable with the threaded holes for at least one angular orientation of the first and third mating surfaces and the plurality of second through-holes adapted to be alignable with the threaded holes for at least one angular orientation of the second and third mating surfaces; and a plurality of threaded fasteners insertable into the plurality of first through-holes and the plurality of first second through-holes, said plurality of threaded fasteners fastenable to the threaded holes for selectively mounting one of said first and second faceplates to the backplane base.

13. The backplane assembly of claim 12, wherein:

the first flange is circular and the plurality of first through-holes is arranged about a circumference of the first flange;

the second flange is circular and the plurality of second through-holes is arranged about a circumference of the second flange; and the plurality of threaded holes are arranged in a circular pattern about the third mating surface such that the plurality of first through-holes are rotatably alignable with the threaded holes for at least one angular orientation of the first and third mating surfaces and the plurality of second through-holes are rotatably alignable with the plurality of threaded holes for at least one angular orientation of the second and third mating surfaces.

14. The backplane assembly of claim 13, wherein:

the plurality of first through-holes are arranged about the circumference of the first flange with substantially equal angular spacings;

the plurality of second through-holes are arranged about the circumference of the second flange with substantially equal angular spacings: and the plurality of threaded holes are arranged about the circumference of the third mating surface with substantially equal angular spacings.

15. The backplane assembly of claim 11, wherein:

the first mating surface includes a first locating element that aligns the first and third fastening structures when said first faceplate is mounted to the backplane base; and the second mating surface includes a second locating element that aligns the second and third fastening structures when said second faceplate is mounted to the backplane base.

16. The backplane assembly of claim 15, wherein:

the first locating element enables repeatable alignment between the backplane base and the first faceplate when said first faceplate is mounted to the backplane base; and the second locating element enables repeatable alignment between the backplane base and the second faceplate when said second faceplate is mounted to the backplane base.

17. The backplane assembly of claim 1, wherein:

said first faceplate includes a first mating surface opposite the first contact surface;

said second faceplate includes a second mating surface opposite the second contact surface; and the backplane bash further comprises a third mating surface, wherein the first, second and third mating surfaces are adapted to promote the efficient transfer of heat energy between the first and the third mating surfaces when the first faceplate is mounted to the backplane base and the efficient transfer of heat energy between the second and the third mating surfaces when the second faceplate is mounted to the backplane base.

18. The backplane assembly of claim 17, wherein the first and third mating surfaces have a substantially direct and continuous contact when said first faceplate is engaged with the backplane base; and the second and third mating surfaces have a substantially direct and continuous contact when said second faceplate is engaged with the backplane base.

19. The backplane assembly of claim 17, wherein the first, second and third mating surfaces are coated with a layer of electroless nickel.

20. The backplane assembly of claim 17, wherein:

the first and third mating surfaces have a conductive heat transfer relationship when said first faceplate is engaged with the backplane base; and the second and third mating surfaces have a conductive heat transfer relationship when said second faceplate is engaged with the backplane base.

21. The backplane assembly of claim 1, wherein:

the backplane bask is moveable between an engaged position and a disengaged position relative to a substrate holder holding the substrate at a predetermined location within the vacuum chamber of the processing system, said backplane base selectively applying a substantially linear force to one side of the substrate;

the first contact surface has a first convex curvature facing the substrate of the first type held by the substrate holder, the substrate flexing to substantially conform to the first convex curvature when the backplane base is moved to the engaged position; and the second contact surface has a second convex curvature facing the substrate of the second type held by the substrate holder, the substrate flexing to substantially conform to the second convex curvature when the backplane base is moved to the engaged position.

22. The backplane assembly of claim 1, wherein:

the first contact surface is circular for contacting a disk-shaped surface of the first type of substrate and has a first outer diameter slightly larger than the outer diameter of the first type of substrate; and the second contact surface is circular for contacting a disk-shaped surface of the second type of substrate and has a second outer diameter slightly larger than the outer diameter of the second type of substrate.

23. The backplane assembly of claim 22 wherein:

the first outer diameter is slightly larger about 150 millimeters; and the second outer diameter is slightly larger than about 200 millimeters.

24. The backplane assembly of claim 1, wherein said backplane base includes:

a heater element for selectively elevating the temperature of the backplane assembly and the substrate above ambient temperature; and a cooling element adjacent the heater element, the cooling element selectively operable for receiving a flow of a chilled fluid for rapidly cooling the heater back to ambient temperature.

25. The backplane assembly of claim 1, wherein said backplane base includes:

a flange for mounting said backplane base to the vacuum chamber;

a heater element for selectively elevating the temperature of the backplane assembly and the substrate; and a cooling element adjacent the heater element, the cooling element selectively operable for receiving a flow of a chilled fluid for cooling the flange.

26. The backplane assembly of claim 1, wherein said backplane base includes:

a mating surface for establishing an efficient thermal contact with each of said first and second faceplates; and a thermocouple sensor positioned adjacent and a small distance beneath the mating surface, the thermocouple sensor automatically coupled to the one of said first and said second faceplates mounted to said backplane base and operable for detecting the temperature of the backplane base proximate the mounted faceplate.

27. A substrate processing system for processing substrates of different configurations and/or dimensions on a sequential basis, comprising:

a vacuum chamber having a ventable processing space and an access port;

a substrate holder positioned within the vacuum chamber, said substrate holder supporting the substrate in a position suitable for processing; and a backplane assembly comprising:

a backplane base mounted in said vacuum chamber, said backplane base including an inlet passageway for heat transfer gas;

a first faceplate sided to be insertable through the access port and removably mountable to said backplane base, said first faceplate having a first contact surface dimensioned and configured to provide an efficient thermal contact with a correspondingly dimensioned and/or configured first type of substrate, said first faceplate including a first inlet port coupled with the inlet passageway for directing heat transfer gas to the first contact surface when the corresponding said first faceplate is mounted to said backplane base to form the mated configuration;

a second faceplate sized to be insertable through the access port and removably mountable to said backplane base, said second faceplate having a second contact surface dimensioned and configured differently than said first contact surface to provide an efficient thermal contact with a correspondingly dimensioned and/or configured second type of substrate, said second faceplate including a second inlet port coupled with the inlet passageway for directing heat transfer gas to the second contact surface when said second faceplate is mounted to said backplane base to form the mated configuration, wherein said first and said second faceplates are alternatively mountable to said backplane base to form a mated configuration therewith for alternatively processing the first and second types of substrates, respectively, in said vacuum chamber; and a vented mounting bolt threadingly received within the inlet passageway and one of the first and second inlet ports for mounting the corresponding one of said first and second face plates to the backplane base to form the mated configuration, said vented mounting bolt having a bore permitting heat transfer gas to flow from each of the first and second inlet ports to the corresponding one of the first and second contact surfaces.

28. The substrate processing system of claim 27, further comprising a source of a coating material operable for supply coating material for application to the exposed surface of the substrate.

29. The substrate processing system of claim 27, wherein said backplane bake includes:

a heater element for selectively elevating the temperature of the backplane assembly and the substrate above ambient temperature; and a cooling element adjacent the heater element, the cooling element selectively operable for receiving a flow of a chilled fluid for rapidly cooling the heater back to ambient temperature.

30. The substrate processing system of claim 29, wherein the substrate processing system further comprises:

a heater control unit electrically coupled to the heater element; and a fluid supply coupled to the cooling system for supplying the flow of the chilled fluid.

31. The substrate processing system of claim 27, wherein: said backplane base includes:

a flange for mounting said backplane base to the vacuum chamber;

a heater element for selectively elevating the temperature of the backplane assembly and the substrate; and a cooling element adjacent the heater element, the cooling element selectively operable for receiving a flow of a chilled fluid for cooling the flange.

32. The substrate processing system of claim 31, wherein the substrate processing system further comprises:

a heater control unit electrically coupled to the heater for selectively energizing the heater element; and a fluid supply coupled to the cooling element for selectively supplying the flow of the chilled fluid.

33. The backplane assembly of claim 27, further comprising a third faceplate, sized to be insertable through the access port and removably mountable to said backplane base, said third faceplate having a contact surface uniquely dimensioned and configured to provide an efficient thermal contact with a correspondingly dimensioned and/or configured third type of substrate, wherein said first faceplate, said second faceplate, and said third faceplate are alternatively mountable to said backplane base to form a mated configuration therewith for alternatively processing the first, second and third types of substrates, respectively, in the vacuum chamber.

34. The backplane assembly of claim 27, further comprising a plurality of more than two faceplates; each of sized to be insertable through the access port and removably mountable to said backplane base, each of said plurality of more than two faceplates having a contact surface uniquely dimensioned and configured to provide an efficient thermal conact with a correspondingly dimensioned and/or configured type of substrate, wherein said plurality of more than two faceplates are alternatively mountable to said backplane base to form a mated configuration therewith for alternatively processing more than two types of substrates, in the vacuum chamber.

35. The substrate processing system of claim 27, wherein:

said backplane base includes an exhaust passageway for heat transfer gas;

said first faceplate includes a first exhaust port to coupled with the exhaust passageway for draining heat transfer gas from the first contact surface when said first faceplate is mounted to said backplane base to form the mated configuration and the first type of substrate is contacting the first contact surface; and said second faceplate includes a second exhaust port coupled with the exhaust passageway for draining heat transfer gas from the second contact surface when said second faceplate is mounted to the backplane base to form the mated configuration and the second type of substrate is contacting the second contact surface.

36. The substrate processing system of claim 35 wherein the first contact surface includes a first gas channel configured to direct heat transfer gas between the first type of substrate and the first contact surface to the second end of the when the first type of substrate is contacting the first contact surface; and the second contact surface includes a second gas channel configured to direct heat transfer gas between the second type of substrate and the second contact surface when the second type of substrate is contacting the second contact surface.

37. The substrate processing system of claim 26, wherein:

the first gas channel includes a first peripheral gas channel extending about a perimeter of the first contact surface and a first connecting gas channel extending from the first gas inlet port to the first peripheral gas channel, and a second connecting gas channel extending from the first gas exhaust port to the first peripheral gas channel; and the second gas channel includes a second peripheral gas channel extending about a perimeter of the second contact surface, a third connecting gas channel extending from the second gas inlet port to the second peripheral gas channel, and a fourth connecting gas channel extending from the second gas exhaust port to the second peripheral gas channel.

38. The substrate processing system of claim 37, wherein:

the first contact surface has a circular outer rim, the first peripheral gas channel extends about a circumference of the outer rim, and the first and second connecting gas channels extend radially to the first peripheral gas channel; and the second contact surface has a circular outer rim, the second peripheral gas channel extends about a circumference of the outer rim, and the third and fourth connecting gas channels extend radially to the second peripheral gas channel.

39. The substrate processing system of claim 27, wherein:

the first contact surface includes a first gas channel configured to direct heat transfer gas from the first gas inlet port between the first type of substrate and the first contact surface when the first type of substrate is contacting the first contact surface; and the second contact surface includes a second gas channel configured to direct heat transfer gas from the second gas inlet port between the second type of substrate and the second contact surface when the second type of substrate is contacting the second contact surface.

40. The substrate processing system of claim 39, wherein:

the first gas channel includes a first peripheral gas channel extending about a perimeter of the first contact surface and a first connecting gas channel extending from the first gas inlet port to the first peripheral gas channel; and the second gas channel includes a peripheral gas channel extending about a perimeter of the second contact surface and a second connecting gas channel extending from the second gas inlet port to the second peripheral gas channel.

41. The substrate processing system of claim 40, wherein:

the first contact surface has a circular outer rim, the first peripheral gas channel extends about a circumference of the outer rim, and the first connecting gas channel extends radially from the first gas inlet port to the first peripheral gas channel; and the second contact surface has a circular outer rim, the second peripheral gas channel extends about a circumference of the outer rim, and the second connecting gas channel extends radially from the second gas inlet port to the second peripheral gas channel.

42. The substrate processing system of claim 27, wherein:

said first faceplate includes a first mating surface opposite the first contact surface and a first fastening structure;

said second faceplate includes a second mating surface opposite the second contact surface and a second fastening structure; and the backplane bash further comprises a third mating surface and a third fastening structure, wherein heat energy is transferred between the first and the third mating surfaces when the first faceplate is mounted to the backplane base and the first and third fastening structures are engaged and heat energy is transferred between the second and the third mating surfaces when the second faceplate is mounted to the backplane base and the second and third fastening structures are engaged.

43. The substrate processing system of claim 42, wherein:

said first faceplate includes a first flange encircling an outer periphery of the first mating surface and the first fastening structure comprises a plurality of first through-holes about the first flange;

said second faceplate includes a second flange encircling an outer periphery of the second mating surface and the second fastening structure comprises a plurality of second through-holes about the second flange;

the third mating surface comprises a plurality of the threaded holes, the plurality of first through-holes adapted to be alignable with the threaded holes for at least one angular orientation of the first and third mating surfaces and the plurality of second through-holes adapted to be alignable with the threaded holes for at least one angular orientation of the second and third mating surfaces; and a plurality of threaded fasteners insertable into the plurality of first through-holes and the plurality of second through-holes, said plurality of threaded fasteners fastenable to the threaded holes for selectively mounting one of said first and second faceplates to the backplane base.

44. The substrate processing system of claim 43, wherein:

the first flange is circular and the plurality of first through-holes is arranged about a circumference of the first flange;

the second flange is circular and the plurality of second through-holes is arranged about a circumference of the second flange; and the plurality of threaded holes are arranged in a circular pattern about the third mating surface such that the plurality of first through-holes are rotatably alignable with the threaded holes for at least one angular orientation of the first and third mating surfaces and the plurality of second through-holes are rotatably alignable with the threaded holes for at least one angular orientation of the second and third mating surfaces.

45. The substrate processing system of claim 44 wherein:

the plurality of first through-holes are arranged about the circumference of the first flange with substantially equal angular spacings;

the plurality of second through-holes are arranged about the circumference of the second flange with substantially equal angular spacings: and the plurality of threaded holes are arranged about the circumference of the third mating surface with substantially equal angular spacings.

46. The substrate processing system of claim 43, wherein:

the first mating surface includes a first locating element that aligns the first and third fastening structures when said first faceplate is mounted to the backplane base; and the second mating surface includes a second locating element that aligns the second and third fastening structures when said second faceplate is mounted to the backplane base.

47. The substrate processing system of claim 46, wherein:

the first locating element enables repeatable alignment between the backplane base and the first faceplate when said first faceplate is mounted to the backplane base; and the second locating element enables repeatable alignment between the backplane base and the second faceplate when said second faceplate is mounted to the backplane base.

48. The substrate processing system of claim 27, wherein:

said first faceplate includes a first mating surface opposite the first contact surface;

said second faceplate includes a second mating surface opposite the second contact surface; and the backplane base further comprises a third mating surface, wherein the first, second and third mating surfaces are adapted to promote the efficient transfer of heat energy between the first and the third mating surfaces when the first faceplate is mounted to the backplane base and the efficient transfer of heat energy between the second and the third mating surfaces when the second faceplate is mounted to the backplane base.

49. The substrate processing system of claim 48, wherein:

the first and third mating surfaces have a substantially direct and continuous contact when said first faceplate is engaged with the backplane base; and the second and third mating surfaces have a substantially direct and continuous contact when said second faceplate is engaged with the backplane base.

50. The substrate processing system of claim 49, wherein the first, second and third mating surfaces are coated with a layer of electroless nickel.

51. The substrate processing system of claim 48, wherein:
the first and third mating surfaces have a conductive heat transfer relationship when said first faceplate is engaged with the backplane base; and
the second and third mating surfaces have a conductive heat transfer relationship when said second faceplate is engaged with the backplane base.

52. The substrate processing system of claim 27, wherein:
the backplane base is moveable between an engaged position and a disengaged position relative to a substrate holder holding the substrate at a predetermined location within the vacuum chamber of the processing system, said backplane base selectively applying a substantially linear force to one side of the substrate;
the first contact surface has a first convex curvature facing the substrate of the first type held by the substrate holder, the substrate flexing to substantially conform to the first convex curvature when the backplane base is moved to the engaged position; and
the second contact surface has a second convex curvature facing the substrate of the second type held by the substrate holder, the substrate flexing to substantially conform to the second convex curvature when the backplane base is moved to the engaged position.

53. The substrate processing system of claim 27, wherein:
the first contact surface is circular for contacting a disk-shaped surface of the first type of substrate and has a first outer diameter slightly larger than the outer diameter of the first type of substrate; and
the second contact surface is circular for contacting a disk-shaped surface of the second type of substrate and has a second outer diameter slightly larger than the outer diameter of the second type of substrate.

54. The substrate processing system of claim 53, wherein:
the first outer diameter is slightly larger about 150 millimeters; and
the second outer diameter is slightly larger than about 200 millimeters.

55. The substrate processing system of claim 27, wherein said backplane base includes:
a mating surface for establishing an efficient thermal contact with each of said first and second faceplates; and
a thermocouple sensor positioned adjacent and a small distance beneath the mating surface, the thermocouple sensor automatically coupled to the one of said first and said second faceplates mounted to said backplane base and operable for detecting the temperature of the backplane base proximate the mounted faceplate.

* * * * *

UNITED STATES PATENT AND TRADEMARK OFFICE
CERTIFICATE OF CORRECTION

PATENT NO.    : 6,645,344 B2
DATED         : November 11, 2003
INVENTOR(S)   : Caldwell et al.

It is certified that error appears in the above-identified patent and that said Letters Patent is hereby corrected as shown below:

<u>Title page,</u>
Item [*], Notice: delete the phrase "by 180 days" and insert -- by 238 days --.

Signed and Sealed this

Sixth Day of July, 2004

JON W. DUDAS
*Acting Director of the United States Patent and Trademark Office*